United States Patent [19]

Okonogi

[11] Patent Number: 5,529,947

[45] Date of Patent: Jun. 25, 1996

[54] SEMICONDUCTOR DEVICE WITH CLAD SUBSTRATE AND FABRICATION PROCESS THEREFOR

[75] Inventor: Kensuke Okonogi, Tokyo, Japan

[73] Assignee: NEC Corporation, Tokyo, Japan

[21] Appl. No.: 356,509

[22] Filed: Dec. 15, 1994

[30] Foreign Application Priority Data

Dec. 15, 1993 [JP] Japan .................................. 5-342849

[51] Int. Cl.⁶ ...................... H01L 21/302; H01L 21/304; H01L 21/306; H01L 21/76

[52] U.S. Cl. ................. 437/62; 437/57; 437/59; 437/72

[58] Field of Search ................... 437/62, 69, 66, 437/67, 68, 72, 73, 974, 59, 56, 57, 86; 257/501, 509, 510; 148/DIG. 163

[56] References Cited

U.S. PATENT DOCUMENTS

| | | | |
|---|---|---|---|
| 4,837,186 | 6/1989 | Ohata et al. | 437/228 |
| 4,963,505 | 10/1990 | Fujii et al. | 437/62 |
| 5,223,450 | 6/1993 | Fujino et al. | 437/67 |
| 5,350,492 | 9/1994 | Hall et al. | 437/56 |
| 5,356,827 | 10/1994 | Ohoka | 437/62 |
| 5,403,769 | 4/1995 | Fujii | 437/63 |

*Primary Examiner*—Mary Wilczewski
*Assistant Examiner*—Brian K. Dutton
*Attorney, Agent, or Firm*—Popham, Haik, Schnobrich & Kaufman, Ltd.

[57] ABSTRACT

On a first surface of a first single crystal silicon substrate, in which a silicon dioxide layer having gradually tapered peripheral edge (tapered wall), a second single crystal silicon substrate is clad. On the second surface of the first single crystal silicon substrate, an island form polycrystalline silicon region is isolated from remaining region by an isolation groove to form an element. By reducing step between the buried silicon dioxide layer and the first single crystal silicon substrate, local concentration of a stress can be successfully avoided. Also, abrasion of the silicon oxide layer and single crystal silicon substrate having mutually different etching speeds is not performed so that the step can be lowered to eliminate formation of void. Between the first surface of the first single crystal silicon substrate formed with the elements and the cladding surface, the silicon dioxide layer is present to avoid influence of contaminant penetrating during cladding process. Accordingly, degradation of reliability due to stress concentration and formation of void, and contamination in the SOI clad substrate can be successfully avoided.

9 Claims, 6 Drawing Sheets

SEMICONDUCTOR DEVICE WITH CLAD SUBSTRATE AND FABRICATION PROCESS THEREFOR

BACKGROUND OF THE INVENTION

1. Field of the Invention

The present invention relates to a semiconductor device with a clad type SOI substrate, in which a high voltage element and other element are provided in such a manner that those elements are insulated by each other.

2. Description of the Related Art

One of the conventionally known semiconductor devices of the type to which the present invention is directed is disclosed in Japanese Unexamined Patent Publication (Kokai) No. Heisei 4-29353. A fabrication process disclosed in the above-identified publication is illustrated in FIGS. 1A to 1D.

At first, as shown in FIG. 1A, on the surface of a first single crystal silicon substrate 21, a step 21a is formed by a reactive ion etching (RIE) method. Subsequently, over the entire surface of the substrate 21, a silicon dioxide layer 22 is formed by way of a thermal oxidation, a low temperature CVD and so forth.

Then, as shown in FIG. 1B, the surface is abraded by lapping, polishing and other methods to remove the stepped upper portion of the silicon dioxide layer 22 with the stepped lower portion remaining. Thus, a substrate with a flat surface is formed.

Subsequently, as shown in FIG. 1C, a second single crystal silicon substrate 23 is clad on the first substrate 21 and firmly bonded through heat treatment. Then, the second single crystal silicon substrate is abraded up to a predetermined thickness.

Thereafter, as shown in FIG. 1D, V-shaped isolation grooves 24 reaching to the silicon dioxide layer 22 are formed on the surface of the second single crystal silicon substrate 23 to isolate an island, single crystal silicon region 23a. Thereafter, on the surface of the isolation grooves 24, silicon dioxide layer 25 is formed. Then, by providing polycrystalline silicon regions 26 filling the isolation grooves 24, the single crystal silicon region 23a is electrically isolated.

For the SOI substrate thus fabricated, a high voltage element (not shown) is formed at a portion not surrounded by the silicon dioxide and another element is formed in the portion surrounded by the silicon dioxide to form a power IC.

In such conventional semiconductor device, in the process step illustrated in FIG. 1B, silicon dioxide layer 22 and the first single crystal silicon substrate 21 are ground simultaneously and subsequently abraded or polished. In such case, due to difference of hardness of the silicon dioxide and single crystal silicon, grinding speed is differentiated. Therefore, a step tends to be formed at an interface between the silicon dioxide layer 22 and the single crystal silicon substrate 21. Such step may cause formation of a void when the single crystal substrate 21 and the second single crystal substrate 23 are clad. Such void may cause failure, such as rupture or so forth during device fabrication. In the experiments performed by the inventors, it has been found that the height of the step becomes 500 Å to 1000 Å, which increases possibility of formation of void.

Also, since the step 21a formed in the process step illustrated in FIG. 1A is steep, it concentration of stress at the step 21a is inherently caused upon formation of the silicon dioxide layer 22. Concentration of stress may cause defects in crystal. In TEM observation after anisotropic etching of the surface defect by the inventors, dislocation or stacking fault present at the interface between the silicon dioxide layer 22 and the single crystal silicon substrate 21 have been observed. The dislocation and/or stacking fault were presented in $10^4$ in number/$cm^2$.

Furthermore, when the clad second single crystal silicon substrate is abraded and polished up to the predetermined thickness, the position of the interface between the second single crystal silicon substrate 23 and the first single crystal silicon substrate 21 (cladding surface) and the surface where the element is formed is reduced. This increases the possibility possibility that the element forming portion will be contaminated by pollutant in the atmosphere through the cladding surface.

SUMMARY OF THE INVENTION

Therefore, it is an object of the present invention to provide a semiconductor device and fabrication method therefore which can solve the problem of reduced reliability due to stress concentration, void formation, contamination and so forth.

According to one aspect of the invention, a semiconductor device having a clad substrate comprises a first single crystal silicon substrate having first and second surfaces, a silicon dioxide layer formed on a part of the first surface of the first single crystal silicon substrate, the silicon dioxide layer having a tapered side wall, an isolating region provided on the second surface of the first single crystal silicon substrate and isolating between a first region, in which the surface of the second surface is aligned with the silicon dioxide layer and a remaining second region, and a second single crystal silicon substrate clad on the first surface of the first single crystal silicon substrate.

In this case, it is possible to form the surface of the silicon dioxide layer to be slightly lower than the surface of the first surface of the first single crystal silicon substrate, and a filler layer may be filled within the lowered region.

According to another aspect of the invention, a fabrication process for a semiconductor device with a clad substrate, comprises the steps of forming a first silicon dioxide layer on a first surface of a first single crystal silicon substrate, forming a silicon dioxide thick layer by partial thermal oxidation of the first silicon oxide layer, forming a stepped recess having tapered side wall by removing the silicon oxide thick layer, forming a second silicon dioxide layer within the stepped recess, performing etching for the first and second silicon dioxide layer and stopping etching at a condition where the first silicon dioxide layer is removed entirely and the second silicon dioxide layer remains, cladding a second single crystal silicon substrate on the first surface of the first single crystal silicon substrate, abrading the second surface of the first single crystal silicon substrate until the thickness of the first single crystal silicon layer becomes a predetermined thickness, and forming a semiconductor element on the second surface.

In the alternative, in place of the step of performing etching for the second silicon oxide layer, the process may comprise the steps of:

performing selective etching for the second silicon dioxide layer for placing the surface of the second silicon dioxide at a lower position than the surface of the first single crystal silicon substrate;

forming a filler layer over the entire surface; and abrading the filler layer until the surface of the first single crystal silicon substrate is exposed.

Then, a second single crystal silicon substrate is clad on the first surface of the first single crystal silicon substrate.

According to the present invention, since the second single crystal silicon substrate is clad with the first single crystal silicon substrate where a silicon dioxide layer having gradually tapered peripheral edge (tapered side wall) is provided, an element is formed in the island-form single crystal silicon region which is defined in the first single crystal silicon substrate, it becomes possible to lower the step between the silicon dioxide layer and the single crystal silicon substrate and to avoid local stress concentration. Also, it becomes possible to obtain the highly reliable semiconductor device with few crystal defects.

Also, since it becomes unnecessary to perform abrasion for the silicon dioxide and the single crystal silicon which have mutually different abrasion speeds, a step formed between the silicon dioxide and the single crystal silicon can be lowered to restrict formation of a void during cladding. This significantly contributes to improvement of yield and lowering the fabrication cost.

Furthermore, when the element is formed on the second surface of the first single crystal silicon substrate, since the silicon dioxide layer is present between the element region and the cladding surface where the first and the second single crystal silicon substrates are clad, contaminant penetrating during cladding should not affect the element.

BRIEF DESCRIPTION OF THE DRAWINGS

The present invention will be understood more fully from the detailed description given below and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The present invention will be discussed in detail hereinafter with reference to FIGS. 2A to 3F. In the following description, numerous specific details are set forth in order to provide a thorough understanding of the present invention. It will be obvious, however, to those skilled in the art that the present invention may be practiced without these specific details. In other instances, well-known structures are not shown in detail in order to avoid unnecessarily obscuring the present invention.

Figure 1A:
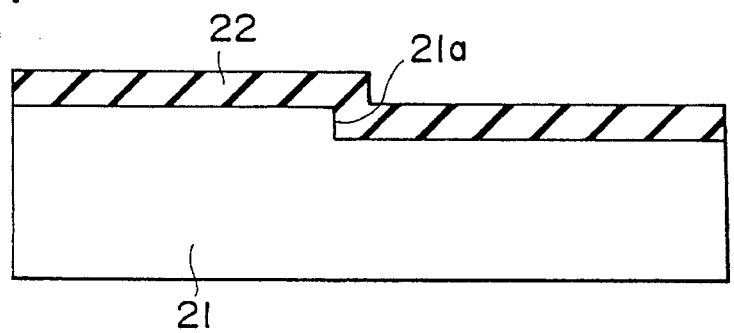
FIGS. 1A to 1D are sections showing process steps in a part of the conventional semiconductor device fabrication process.
Figure 1B:
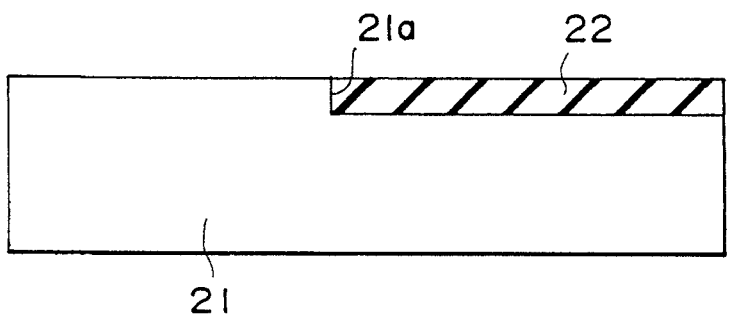
Figure 1C:
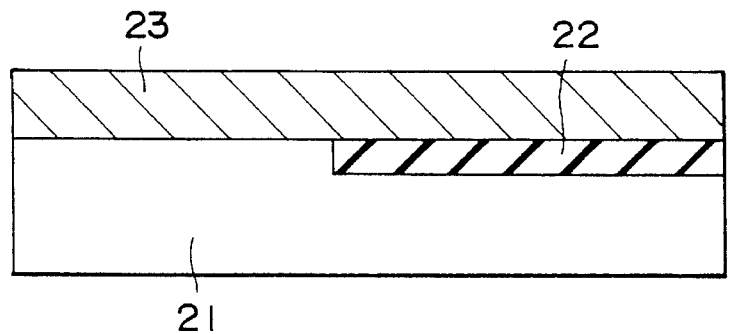
Figure 1D:
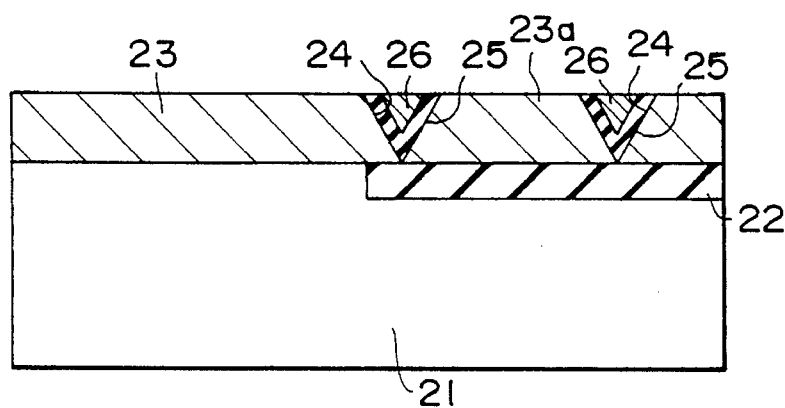
Figure 2A:
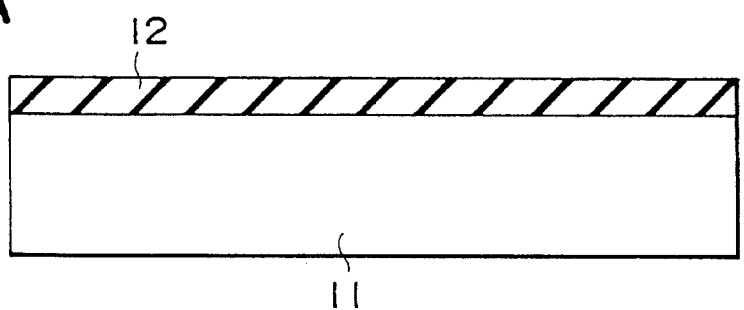
FIGS. 2A to 2L are sections showing process steps in the first preferred embodiment of a semiconductor device fabricating process according to the present invention.

FIG. 2L is a section showing the first embodiment of a semiconductor device according to the present invention. FIGS. 2A to 2K are sections showing respective process steps for fabricating the first embodiment of the semiconductor device. The structure of the shown embodiment of the semiconductor device will become clear from the following discussion for the fabrication process thereof.

At first, as shown in FIG. 2A, the surface (a first surface) of a first single crystal silicon substrate 11 is subject to a thermal oxidation to form a first silicon dioxide layer 12 in a thickness of approximately 400 Å.

Figure 2B:
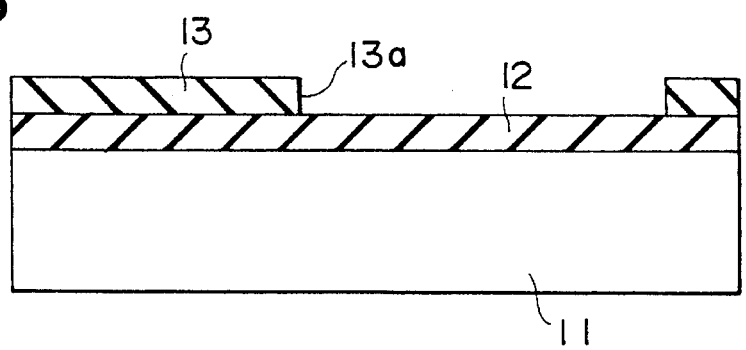

Next, as shown in FIG. 2B, over the entire surface of the first silicon dioxide layer 12, a silicon nitride layer 13 is deposited in a thickness of approximately 1000 Å. Then, for a portion to be formed with a low voltage element (or a circuit control element), the silicon nitride layer 13 is selectively etched by way of a photolithography to form an opening 13a.

Figure 2C:
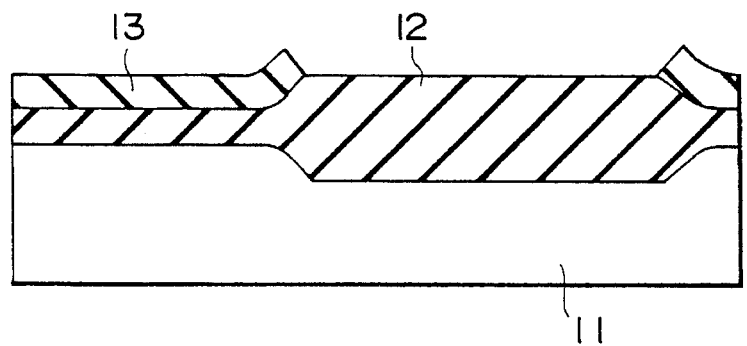

Subsequently, as shown in FIG. 2C, by way of pressurized oxidation, the part of the silicon dioxide layer 12 which is exposed in the opening 13a of the silicon nitride layer 13 is oxidized. By this, the thickness of the silicon dioxide layer 12 within the opening 13a becomes substantially twice thicker than the other part and peripheral portion (side wall) of the silicon dioxide layer 12 becomes a gradual step, like as a bird's beak.

Figure 2D:
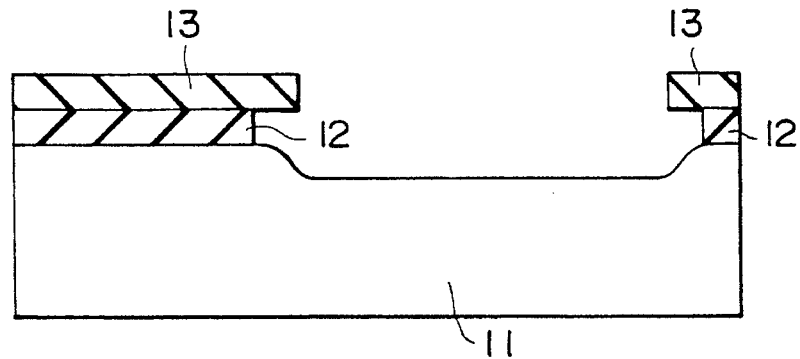

Then, as shown in FIG. 2D, only the silicon dioxide layer 12 within the opening 13a of the silicon nitride layer 13 is removed by wet etching.

Figure 2E:
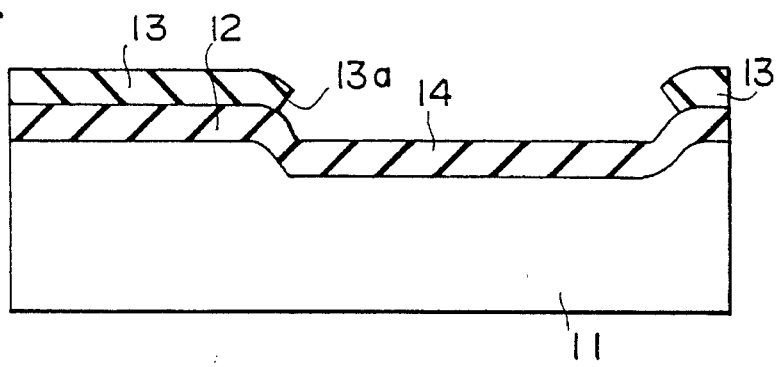

Subsequently, as shown in FIG. 2E, thermal oxidation is again effected to form a second silicon dioxide layer 14 in a thickness of approximately 400 Å for the portion where the single crystal silicon substrate 11 is exposed through etching in the immediate preceding step.

Figure 2F:
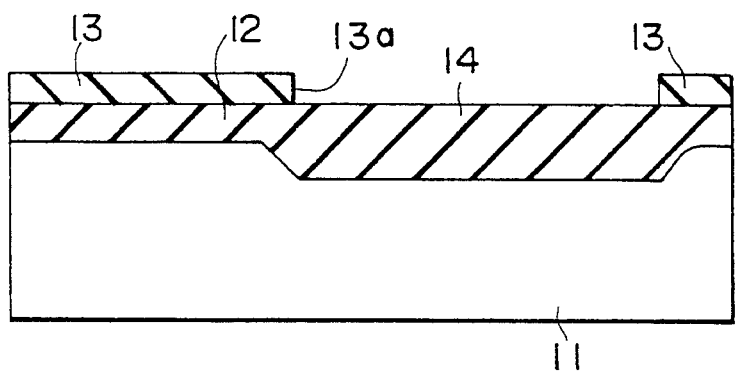

By further performing pressurized oxidation, the second silicon dioxide layer 14 is formed into a thickness approximately 1 to 2 μm as shown in FIG. 2F. By this, the height of the second silicon dioxide layer 14 becomes substantially at the same height to the surface of the first silicon dioxide layer 12.

Figure 2G:
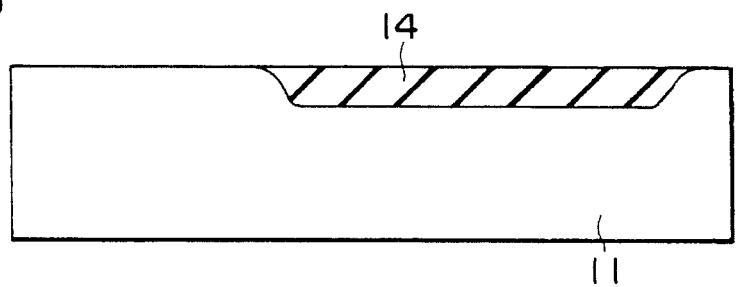

Next, as shown in FIG. 2G, an etching such as a plasma etching or so forth is performed for the silicon nitride layer 13. Then, wet etching is effected for the first and second silicon dioxide layers 12 and 14 for removing in a thickness of approximately 400 Å over the entire surfaces thereof. Thus, the second silicon dioxide layer 14 placed in a region corresponding to the opening 13a is left in the first single crystal silicon substrate 11.

Figure 2H:
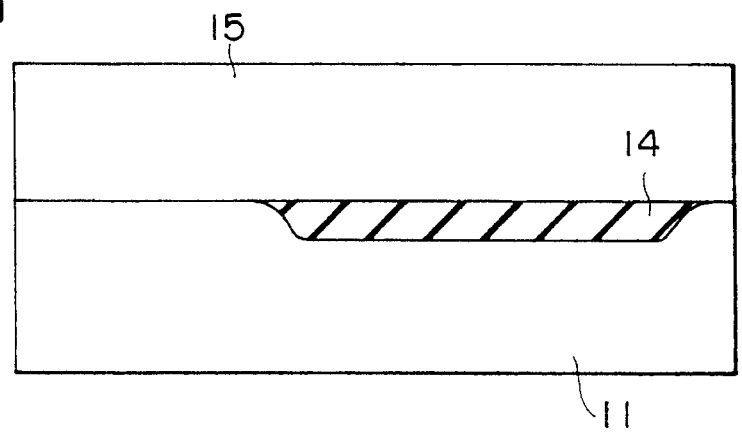
Figure 2:
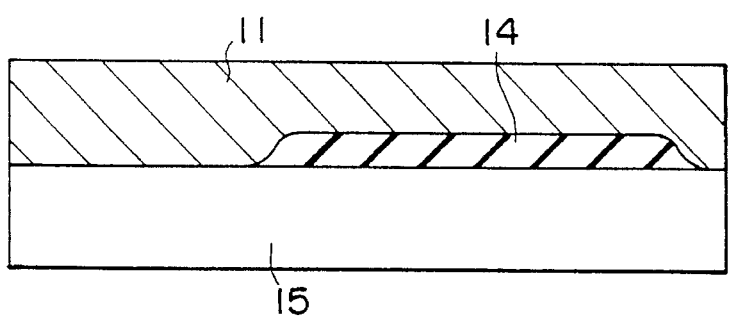
Figure 2:
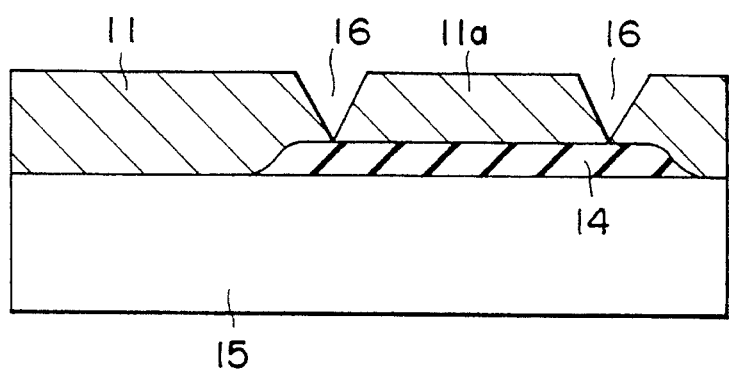
Figure 2:
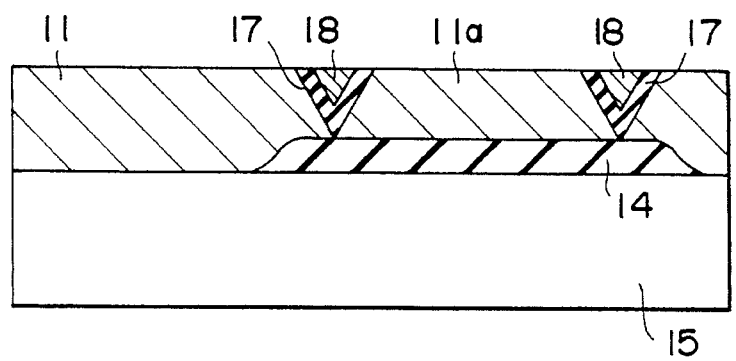
Figure 2:
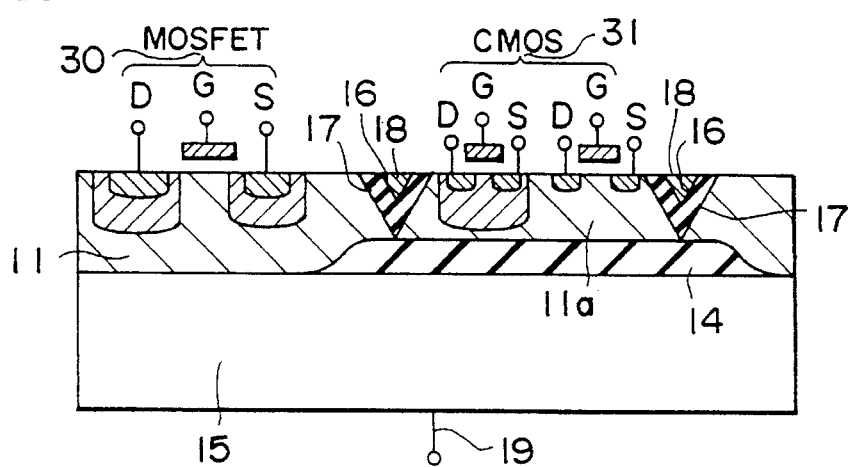

Subsequently, as shown in FIG. 2H, for the first single crystal silicon substrate 11 processes as set forth above and whereby containing the second silicon dioxide layer 14, a second single crystal silicon substrate 15 is clad. In the cladding process, similar to the prior art, the cladding method to perform cladding through steps of washing, stacking and effecting heat treatment can be employed. As a result, a silicon substrate, in which the silicon dioxide layer 14 is partly buried between the first and second single crystal silicon substrates 11 and 15 can be formed.

Thereafter, the silicon substrate is reversed in upside-down manner to place the first single crystal silicon substrate 11 at upper side, as shown in FIG. 2I. Then, the abrasion is effected for the upper surface (a second surface) of the first single crystal silicon substrate 11 up to a predetermined thickness.

Then, as shown in FIG. 2J, predetermined regions in the first single crystal silicon layer 11 located above the silicon dioxide layer 14 are subject to wet etching by way of anisotropic etching to form a V-shaped groove 16. In the alternative, the V-shaped groove 16 may also be formed by forming a trench-shaped configuration by way of dry etching. As set forth above, the V-shaped groove 16 reaching to the silicon dioxide layer 14 is formed in the first single crystal silicon substrate 11. An island-form single crystal silicon region 11a is defined by isolating groove.

Thereafter, as shown in FIG. 2K, third silicon dioxide layer 17 is formed within the isolation groove 16, and then polycrystalline silicon is filled in the isolation groove 16 to form polycrystalline silicon regions 18. By this, the island form single crystal silicon region 11a is then electrically isolated to complete element separation.

Thereafter, diffusion for fabricating a device is effected for the first single crystal silicon substrate 11 to form a vertical MOSFET 30 as a power element MOSFET 30 is formed on the surface of the first single crystal silicon substrate 11 where the buried silicon dioxide layer 14 is not present. On the other hand, in the island-form single crystal silicon region 11a above the silicon dioxide layer 14, a CMOS 31 as a circuit element for controlling the power element is formed. By this, the semiconductor device integrally formed with the power element of high voltage and high current and the low voltage element can be completed.

Accordingly, in the semiconductor device fabricated through the process set forth above, since the cross-sectional configuration of the buried silicon dioxide layer 14 may have the bird's beak-like gradual step-shaped edge. Concentration of stress can be effectively avoided and thus formation of defect in the crystal can be successfully avoided.

Also, in the foregoing fabrication process, since there is no abrasion process step for simultaneously abrading the silicon dioxide layer and the single crystal silicon substrate having mutually different etching speed, the height of the step possibly formed during abrasion process can be restricted to be less than or equal to 500 Å. This height is much smaller than the possible height of the step, i.e., 500 Å to 1000 Å in the prior art. Therefore, formation of void can be successfully restricted.

Furthermore, in the completed semiconductor device of the shown embodiment, the cladding surface is placed below the buried silicon dioxide layer 14 as can be clear from FIG. 2L. Therefore, since the buried silicon dioxide layer 14 is present between the cladding surface of the substrates 11, 15 and the surface of the single crystal silicon substrate 11 where device should be formed, contaminant (e.g. boron, heavy metal element and so forth) possibly penetrated during cladding process will not affect the device formed on the surface of first single crystal silicon substrate 11.

Figure 3A:
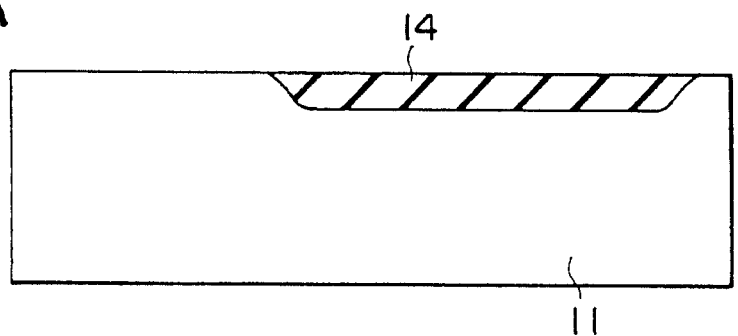
FIGS. 3A to 3F are sections showing process steps in the second preferred embodiment of a semiconductor device fabricating process according to the present invention.

FIGS. 3A to 3F are sections showing the process steps in the second embodiment of the semiconductor device fabrication process according to the present invention. It should be noted that the second embodiment of the fabrication process has common process steps to the foregoing first embodiments in the steps illustrated in FIGS. 2A to 2G. Therefore, after the common process steps to the foregoing first embodiment of the semiconductor device fabricating process of FIGS. 2A to 2G, the substrate as illustrated in FIG. 3A is prepared.

Figure 3B:
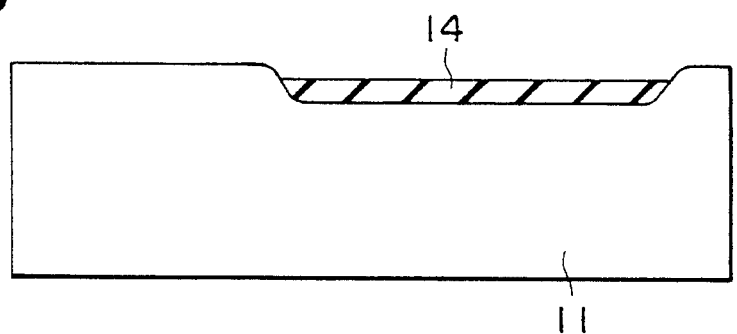

Subsequently, as shown in FIG. 3B, the buried silicon dioxide layer 14 is subject to wet etching to lower the surface thereof at a position lower than the surface of the single crystal silicon substrate 11. The height of the step between the surface of the silicon dioxide layer 14 and the surface of the single crystal silicon substrate 11 is in a range of approximately 500 to 2000 Å.

Figure 3C:
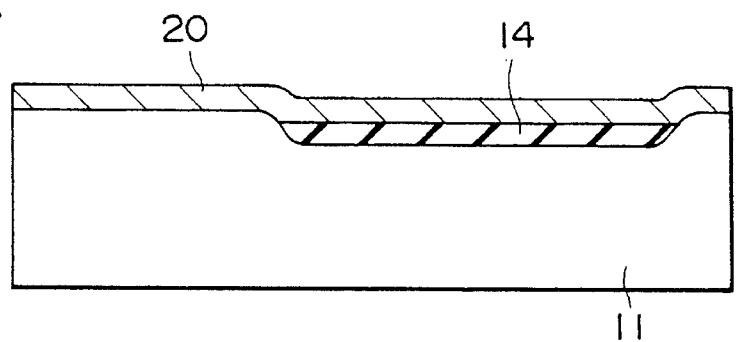

Then, as shown in FIG. 3C, over the entire surface, a filler layer 20 of a solid state silicon, such as a fine particle polycrystalline silicon, amorphous silicon and so forth, is formed in a thickness of approximately 2 μm or less.

Figure 3D:
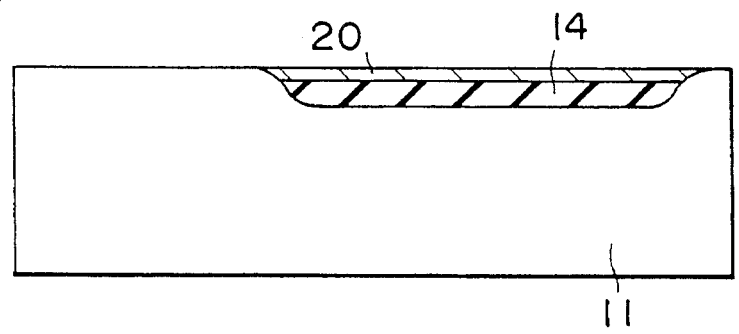

Subsequently, as shown in FIG. 3D, the filler layer 20 is abraded to expose the surface of the first single crystal silicon substrate 11 in the region where the buried silicon dioxide layer 14 is not present. In this case, the surface of the single crystal silicon substrate 11 may be slightly abraded. However, at this time, since the filler layer 20 is present above the silicon dioxide layer 14, the height of the step to be possibly formed through abrasion becomes smaller than that to be formed during the step of FIG. 2G, in which the single crystal silicon substrate 11 and the silicon dioxide layer 14 are abraded simultaneously.

Figure 3E:
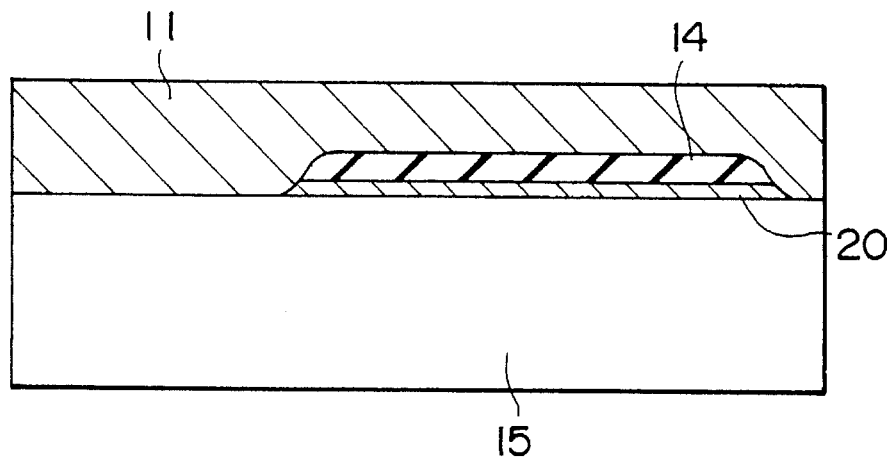

Next, as shown in FIG. 3E, the second single crystal silicon substrate 15 is clad and the substrate thus formed is reversed to be upside-down. Then, the first single crystal silicon substrate 11 is abraded to reduce the thickness up to approximately 50 μm.

Figure 3F:
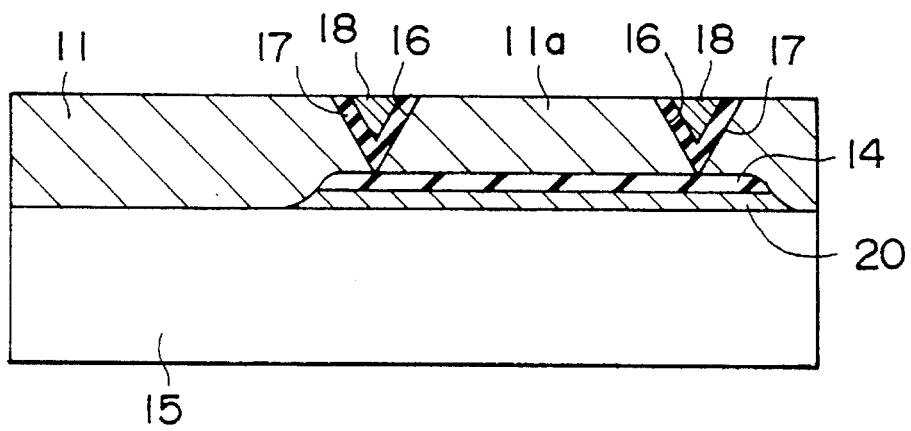

Thereafter, as shown in FIG. 3F, from the surface of the first single crystal silicon substrate 11, the V-shaped groove 16 reaching the silicon dioxide layer 14 is formed by way of wet etching. Subsequently, on the inner surface of the groove 16, the third silicon dioxide layer 17 is formed. Also, the groove 16 is filled with the polycrystalline silicon region 18 to complete element isolation. An island-form single crystal silicon region 11a is defined by groove 16.

Even in this second embodiment, since the step of the buried silicon dioxide layer 14 is gradual, no concentration of the stress may occur and formation of void due to step formed during abrasion process can be successfully avoided. Furthermore, similarly to the foregoing first embodiment, affect of the contaminant penetrated during cladding process can be successfully avoided.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A fabrication process for a semiconductor device with a clad substrate, comprising the steps of:

forming a first silicon dioxide layer on a first surface of a first single crystal silicon substrate, the first single crystal silicon substrate having a second surface opposite the first surface;

forming a silicon dioxide region by partial thermal oxidation of the first silicon dioxide layer and the first single crystal silicon substrate;

forming a stepped recess having a tapered side wall by removing the silicon dioxide region;

forming a second silicon dioxide layer within the stepped recess;

performing etching of the first and second silicon dioxide layers and stopping etching at a condition where the first silicon dioxide layer is removed entirely and the second silicon dioxide layer remains;

cladding a second single crystal silicon substrate on the first surface of the first single crystal silicon substrate;

abrading the second surface of the first single crystal silicon substrate to control the thickness of the first single crystal silicon layer; and forming a semiconductor element on the second surface of the first single crystal silicon substrate.

2. The process of claim 1, further comprising a step of forming an isolating region on the second surface of the first single crystal silicon substrate, between the steps of abrading the second surface and of forming the semiconductor element, wherein the isolating region isolates a first region that is aligned with the second silicon dioxide layer and a second region that is not aligned with the second silicon dioxide layer.

3. The process of claim 2, wherein the step of forming the isolating region comprises the steps of:

forming a V-shaped groove on the second surface of the first single crystal silicon substrate;

forming a third silicon dioxide layer on the inner surface of the V-shaped groove; and filling a polycrystalline silicon region within the V-shaped groove.

4. The process of claim 2, wherein the step of forming the semiconductor element comprises the steps of:

forming a control circuit element in the first region; and forming a power element in the second region.

5. A fabrication process for a semiconductor device with a clad substrate, comprising the steps of:

forming a first silicon dioxide layer having a surface on a first surface of a first single crystal silicon substrate, the first single crystal silicon substrate having a second surface opposite the first surface;

forming a silicon dioxide region by partial thermal oxidation of the first silicon dioxide layer and the first single crystal silicon substrate;

forming a stepped recess having a tapered side wall by removing the silicon dioxide region;

forming a second silicon dioxide layer having a surface within the stepped recess;

performing selective etching of the second silicon dioxide layer to place the surface of the second silicon dioxide layer at a lower position than the surface of the first single crystal silicon substrate;

forming a filler layer on an entire surface of the first single crystal silicon substrate and the second silicon dioxide layer;

abrading the filler layer until the surface of the first single crystal silicon substrate is exposed;

cladding a second single crystal silicon substrate on the first surface of the first single crystal silicon substrate;

abrading the second surface of the first single crystal silicon substrate to control the thickness of the first single crystal silicon substrate; and forming a semiconductor element on the second surface.

6. The process of claim 5, further comprising a step of forming an isolating region on the second surface of the first single crystal silicon substrate, after the step of abrading the second surface of the first single crystal silicon substrate is performed, and before the step of forming the semiconductor element is performed, wherein the isolating region isolates a first region that is aligned with the second silicon dioxide layer and a second region that is not aligned with the second silicon dioxide layer.

7. The process of claim 6, wherein the step of forming the isolating region comprises the steps of:

forming a V-shaped groove on the second surface of the first single crystal silicon substrate;

forming a third silicon dioxide layer on the inner surface of the V-shaped groove; and filling a polycrystalline silicon region within the V-shaped groove.

8. The process of claim 6, wherein the step of forming the semiconductor element includes the steps of:

forming a control circuit element in the first region of the first single crystal silicon substrate; and forming a power element in the second region of the first single crystal silicon substrate.

9. The process of claim 5, wherein the filler layer is formed of one of a polycrystalline silicon and an amorphous silicon.

* * * * *